(12) United States Patent
Hekmatshoartabari et al.

(10) Patent No.: US 11,456,308 B2
(45) Date of Patent: Sep. 27, 2022

(54) LOW-VOLTAGE FLASH MEMORY INTEGRATED WITH A VERTICAL FIELD EFFECT TRANSISTOR

(71) Applicant: INTERNATIONAL BUSINESS MACHINES CORPORATION, Armonk, NY (US)

(72) Inventors: Bahman Hekmatshoartabari, White Plains, NY (US); Alexander Reznicek, Troy, NY (US); Takashi Ando, Eastchester, NY (US); Nanbo Gong, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/062,647

(22) Filed: Oct. 5, 2020

(65) Prior Publication Data
US 2022/0108997 A1    Apr. 7, 2022

(51) Int. Cl.
*G11C 11/34* (2006.01)
*H01L 27/11524* (2017.01)
(Continued)

(52) U.S. Cl.
CPC .... *H01L 27/11524* (2013.01); *G11C 16/0433* (2013.01); *G11C 16/10* (2013.01);
(Continued)

(58) Field of Classification Search
CPC ......... H01L 27/11524; H01L 29/66666; H01L 29/66825; H01L 29/7827; H01L 29/7883;
(Continued)

(56) References Cited

U.S. PATENT DOCUMENTS 8,759,906 B2 * 6/2014 Sung .................. H01L 29/7827
257/329
9,305,650 B2    4/2016 Gopalakrishnan
(Continued)

FOREIGN PATENT DOCUMENTS

WO    2022073726 A1    4/2022

OTHER PUBLICATIONS

June-MO Koo et al., "Vertical Structure NAND Flash Array Integration with Paired FinFET Multi-bit Scheme for High-Density NAND Flash memory Application", 2008, Symposium of VLSI Technology Digest, IEEE, pp. 120-121 (Year: 2008).*
(Continued)

*Primary Examiner* — Viet Q Nguyen
(74) *Attorney, Agent, or Firm* — L. Jeffrey Kelly

(57) ABSTRACT

A circuit may include a low-voltage flash memory integrated with a vertical field effect transistor and a non-volatile memory element. The low-voltage flash memory may be coupled to the non-volatile memory element by the vertical field effect transistor, one or more bit-lines, and one or more word-lines. The low-voltage flash memory may provide a lower significance conductance and the non-volatile memory element may provide a higher significance conductance. The low-voltage flash memory may include a source and a drain. The source may be separated from the drain by an epitaxial channel. The low-voltage flash memory may include a floating gate. The floating gate may be separated from the epitaxial channel by a first dielectric layer. The low-voltage flash memory may include a control gate. The control gate may be separated from the floating gate by a second dielectric layer.

21 Claims, 14 Drawing Sheets

(51) Int. Cl.
    *G11C 16/04*       (2006.01)
    *G11C 16/10*       (2006.01)
    *G11C 16/26*       (2006.01)
    *H01L 29/66*       (2006.01)
    *H01L 29/78*       (2006.01)
    *H01L 29/788*      (2006.01)

(52) U.S. Cl.
    CPC ........ *G11C 16/26* (2013.01); *H01L 29/66666* (2013.01); *H01L 29/66825* (2013.01); *H01L 29/7827* (2013.01); *H01L 29/7883* (2013.01); *H01L 29/7889* (2013.01)

(58) Field of Classification Search
    CPC . H01L 29/7889; G11C 16/0433; G11C 16/10; G11C 16/26
    USPC .................................................... 365/185.18
    See application file for complete search history.

(56) References Cited

U.S. PATENT DOCUMENTS

| | | | |
|---|---|---|---|
| 9,660,105 B2 | 5/2017 | Divakaruni | |
| 9,691,819 B2* | 6/2017 | Oh | H01L 27/2454 |
| 9,780,100 B1* | 10/2017 | Balakrishnan | H01L 28/00 |
| 9,799,777 B1* | 10/2017 | Balakrishnan | H01L 21/823487 |
| 9,806,155 B1* | 10/2017 | Basker | H01L 21/32051 |
| 10,170,186 B1 | 1/2019 | Yau | |
| 10,203,885 B2* | 2/2019 | Tanzawa | H01L 27/1159 |
| 10,269,869 B1* | 4/2019 | Ando | H01L 29/66439 |
| 10,283,565 B1 | 5/2019 | Xu | |
| 10,297,749 B1 | 5/2019 | Hashemi | |
| 10,396,086 B2* | 8/2019 | Son | H01L 27/11556 |
| 10,453,531 B1* | 10/2019 | Petti | H01L 27/2454 |
| 10,839,897 B1* | 11/2020 | Bai | G11C 13/003 |
| 2013/0270508 A1* | 10/2013 | Li | H01L 45/1206 257/4 |
| 2019/0051659 A1* | 2/2019 | Xie | H01L 27/11521 |
| 2019/0244666 A1* | 8/2019 | Hsu | G11C 14/009 |

OTHER PUBLICATIONS

Ambrogio et al., "Equivalent-accuracy accelerated neural-network training using analogue memory," Nature, vol. 558, Jun. 2018, pp. 60-67.

Demler, "Mythic Multiples in a Flash", Analog In-Memory Computing Eliminates DRAM Read/Write Cycles, The Linley Group, Microprocessor report, Insightful Analysis of Processor Technology, Aug. 27, 2018, pp. 1-3.

Fick, "Analog Computation in Flash Memory for Datacenter-scale AI Inference in a Small Chip", Mythic @ Hot Chips 2018, Aug. 22, 2018, https://medium.com/mythic-ai/mythic-hot-chips-2018-637dfb9e38b7, 3 pages.

Gao et al., "Programmable Linear RAM: A New Flash Memory-based Memristor for Artificial Synapses and Its Application to Speech Recognition System," International Electron Devices Meeting (IEDM), © 2019 IEEE, p. 14.1.1-14.1.4.

Moore, "Two Startups Use Processing in Flash Memory for AI at the Edge", Mythic AI and Syntiant sound similar on the surface, but they're after different markets, Aug. 13, 2018, 2 pages.

Ando et al., "On the Electron and Hole Tunneling in a HfO2 Gate Stack With Extreme Interfacial-Layer Scaling", IEEE Electron Device Letters, vol. 32 Issue 7, Date of Publication May 19, 2011, 3 pages.

* cited by examiner

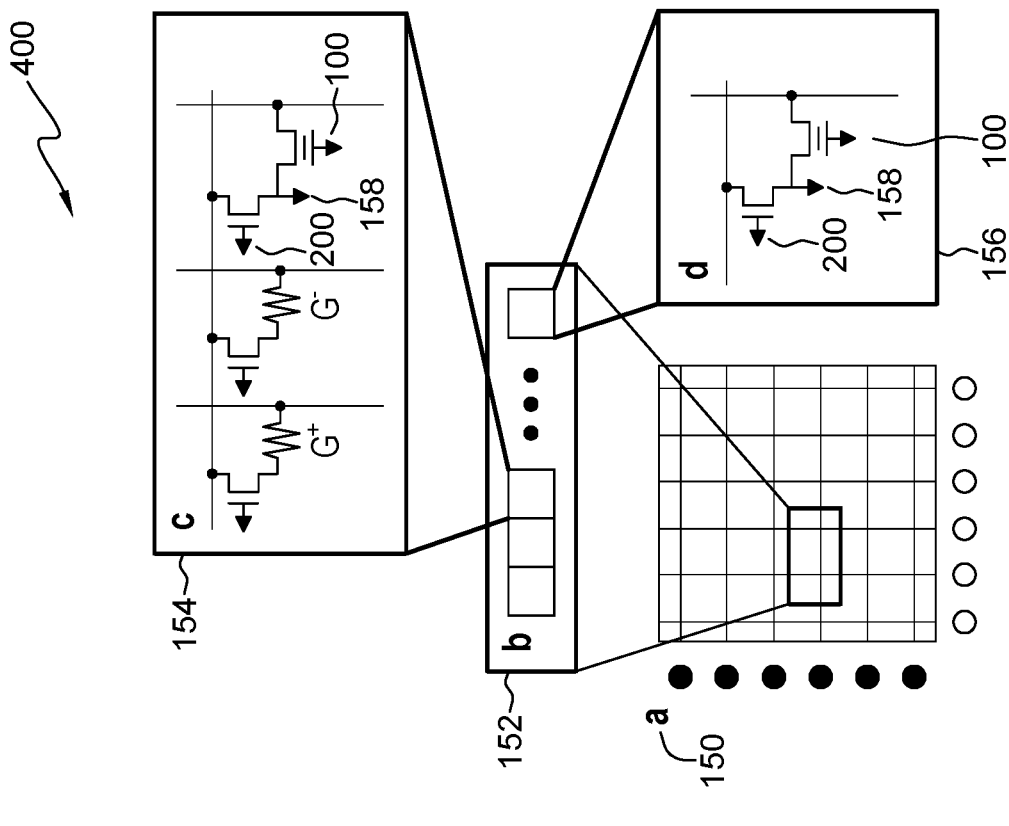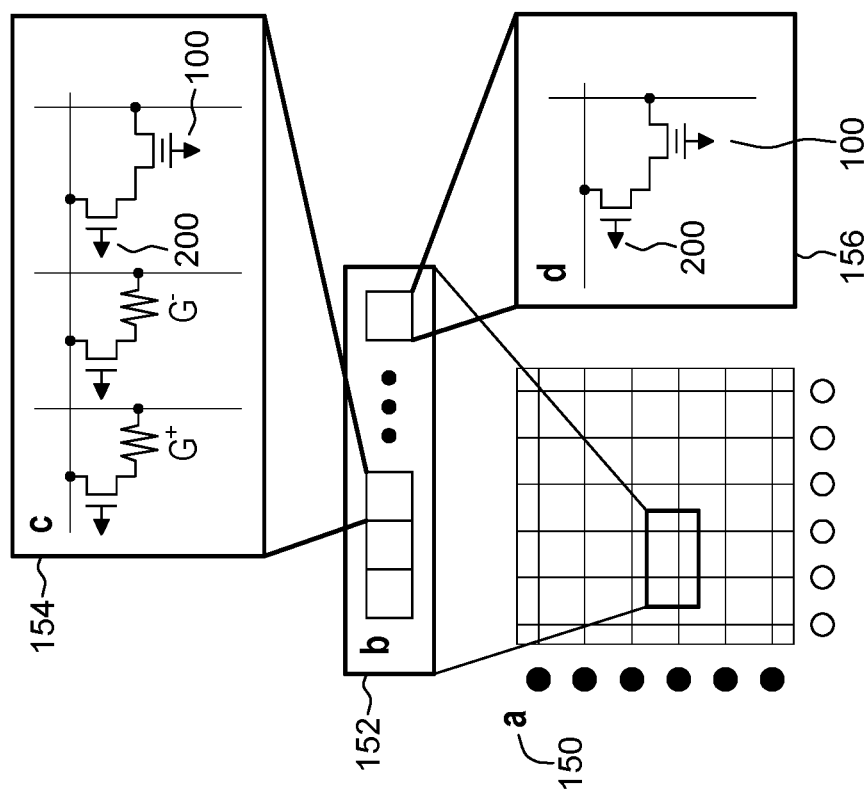
FIG. 13

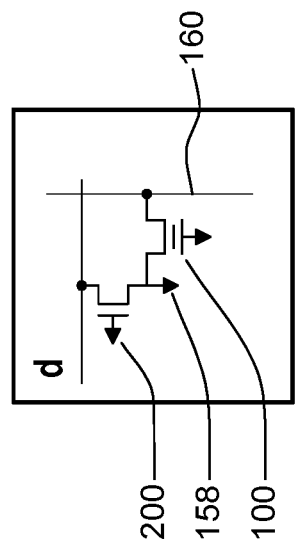
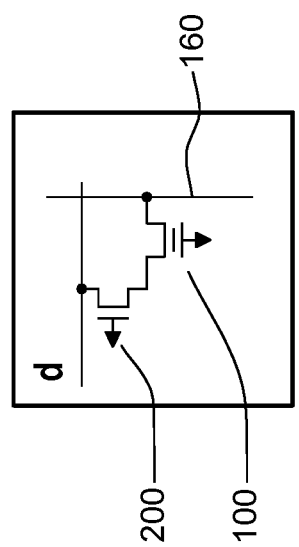
FIG. 14

LOW-VOLTAGE FLASH MEMORY INTEGRATED WITH A VERTICAL FIELD EFFECT TRANSISTOR

BACKGROUND

The present invention relates generally to a semiconductor structure and a method of forming the same. More particularly, the present invention relates to a semiconductor structure that includes a low-voltage flash memory integrated with a vertical field effect transistor (VFET).

Deep learning is a machine learning method based on artificial neural networks inspired by information processing in biological systems. In neuromorphic computing, electronic analog circuits are used to mimic neuro-biological architectures present in the nervous system.

SUMMARY

According to one embodiment of the present invention, a circuit is provided. The circuit may include a low-voltage flash memory integrated with a vertical field effect transistor and a non-volatile memory element. The low-voltage flash memory may be coupled to the non-volatile memory element by the vertical field effect transistor, one or more bit-lines, and one or more word-lines. The low-voltage flash memory may provide a lower significance conductance and the non-volatile memory element may provide a higher significance conductance. The low-voltage flash memory may include a source and a drain. The source may be separated from the drain by an epitaxial channel. The low-voltage flash memory may include a floating gate. The floating gate may be separated from the epitaxial channel by a first dielectric layer. The low-voltage flash memory may include a control gate. The control gate may be separated from the floating gate by a second dielectric layer. The low-voltage flash memory may be programmed by applying voltage pulses of opposite polarities to the control gate. The low-voltage flash memory may be programmed by switching off the vertical field effect transistor and applying a program voltage to the control gate of the low-voltage flash memory. The low-voltage flash may be read by turning on the vertical field effect transistor and applying a read voltage to the control gate of the low-voltage flash memory. The source, the drain, and the epitaxial channel may be doped with an n-type dopant. The non-volatile memory element may be a phase-change memory, resistive random access memory, magnetic random access memory, or a flash memory.

According to another embodiment of the present invention, a semiconductor structure is provided. The semiconductor structure may include a low-voltage flash memory integrated with a vertical field effect transistor and a non-volatile memory element. The low-voltage flash memory may be coupled to the non-volatile memory element by the vertical field effect transistor, one or more bit-lines, and one or more word-lines. The low-voltage flash memory may include a first source drain, a second source drain, a floating gate, and a control gate. The second source drain may be separated from the first source drain by an epitaxial channel. The floating gate may be separated from the epitaxial channel by a first dielectric layer. The control gate may be separated from the floating gate by a second dielectric layer. The floating gate may have a doping type that is opposite to a doping type of the epitaxial channel. The first source drain, the second source drain, and the epitaxial channel may be doped with an n-type dopant. The first dielectric may be made of high-k dielectric material. The low-voltage flash memory may be vertical and may be separated from the vertical field effect transistor by a shallow trench isolation. The non-volatile memory element may be a phase-change memory, resistive random access memory, magnetic random access memory, or a flash memory.

According to another embodiment of the present invention, a method is provided. The method may include forming a low-voltage flash memory integrated with a vertical field effect transistor and a non-volatile memory element. The method may include forming a shallow trench isolation between the low-voltage flash memory and the vertical field effect transistor. The low-voltage flash memory may be coupled to the non-volatile memory element by the vertical field effect transistor. Forming the low-voltage flash memory may include growing a first source drain on a substrate, epitaxially growing an epitaxial channel on the first source drain, epitaxially growing a second source drain on the epitaxial channel, forming a floating gate around the epitaxial channel, and forming a control gate around the floating gate, the control gate being separated from the floating gate by a first dielectric layer. The first dielectric layer may be made of a high-k dielectric material. The first source drain, the epitaxial channel, and the second source drain may be doped with an n-type dopant. The non-volatile memory element may be a phase-change memory, resistive random access memory, magnetic random access memory, or a flash memory. The floating gate may have a doping type that is opposite to a doping type of the epitaxial channel.

BRIEF DESCRIPTION OF THE DRAWINGS

The following detailed description, given by way of example and not intend to limit the invention solely thereto, will best be appreciated in conjunction with the accompanying drawings, in which:

FIG. 13 are simplified circuit diagrams of memory arrays of analog memory unit cells according to an exemplary embodiment; and FIG. 14 are simplified circuit diagrams showing the vertical field effect transistor and the low voltage flash according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
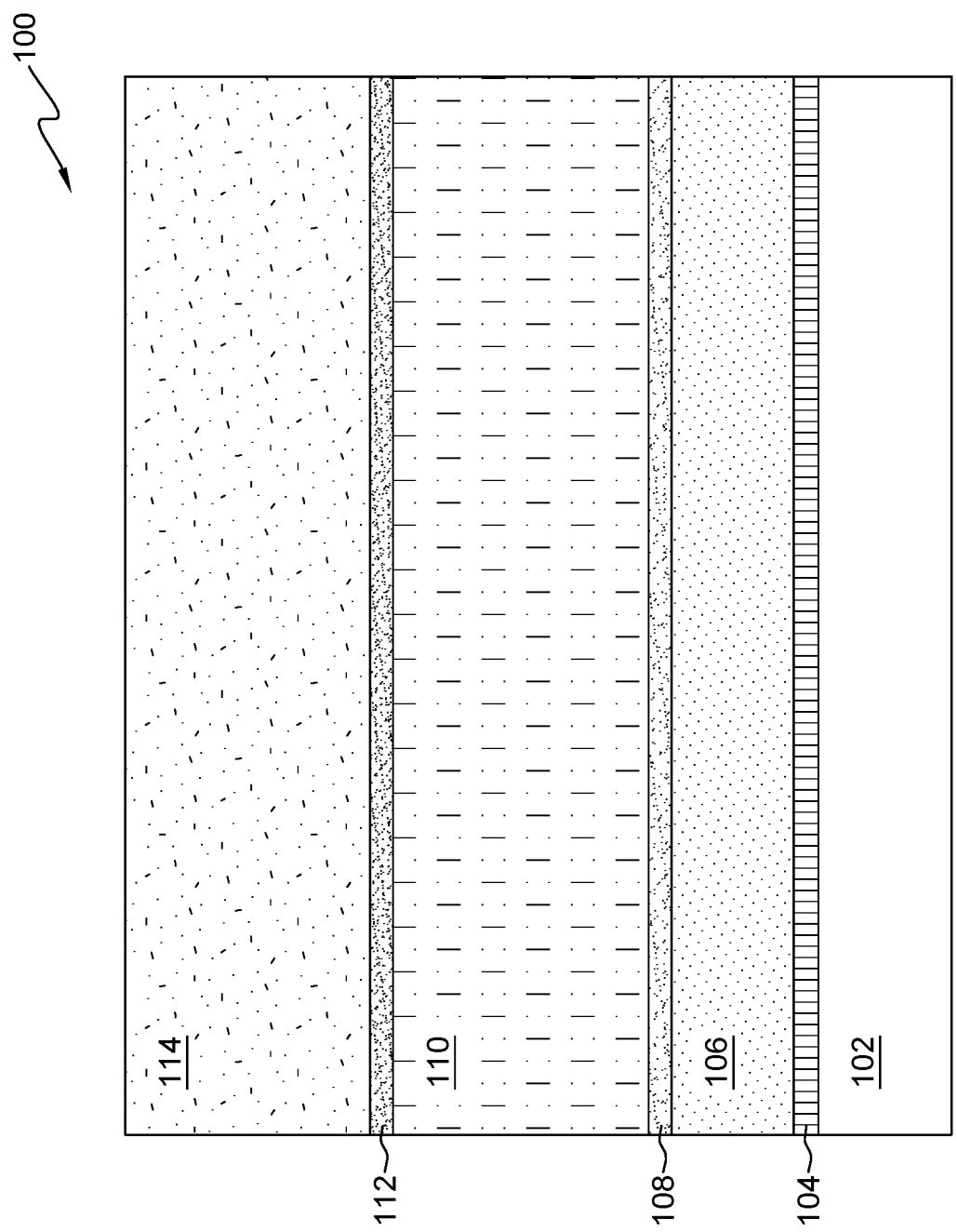
FIG. 1 is a cross section view illustrating a dummy gate and a dielectric capping layer arranged on a substrate according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to a semiconductor structure that includes a low-voltage flash memory integrated with a vertical field effect transistor (VFET).

Deep learning is a machine learning method based on artificial neural networks. Computation for deep neural networks may include both training and forward inference.

For neuromorphic computing, memory elements that are sufficiently linear and that have sufficiently long retention times are needed. However, conventional single-device memory elements are either sufficiently linear or have sufficiently long retention times, but not both. As a result, hybrid designs are contemplated. Conventional hybrid designs integrate a phase change memory cell with a capacitor. The phase change memory may provide long retention times and the capacitor may provide linearity. Nevertheless, even with the hybrid design, the capacitor has a low retention time. As a result, the capacitor needs to transfer the program state to the phase change memory to avoid loss of data. Further, utilizing the phase change memory cell, in combination with the capacitor, requires a complicated circuit that includes several transistors, phase change memory cells and capacitors. As such, there exists a need to fabricate a device that is sufficiently linear, has sufficiently long retention times, and allows a simple circuit design.

Embodiments of the present invention relate to a semiconductor structure that includes a low-voltage flash memory integrated with a VFET. More particularly, embodiments of the present invention provide a new circuit structure and an integration technique for vertically fabricating the low-voltage flash memory integrated with a VFET, thus reducing the device footprint and allowing for more devices to be integrated in a given chip area. The new circuit structure may include a low-voltage flash memory integrated with a VFET and a non-volatile memory.

FIGS. 1-11 illustrate a method of making a vertical low-voltage flash memory. FIGS. 12-14 illustrate an exemplary circuit structure that includes a vertical low-voltage flash memory integrated with a VFET and a non-volatile memory.

Referring now to FIG. 1, a structure 100 is shown, in accordance with an embodiment. The structure 100 may include a substrate 102, a counter-doped layer 104, a source 106, a first spacer 108, a dummy gate 110, a second spacer 112, and a dielectric capping layer 114. The substrate 102 may include one or more semiconductor materials. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In an embodiment, the substrate 102 may include silicon.

The counter-doped layer 104 is deposited onto the top surface of the substrate 102. The source 106 is then arranged on the substrate 102 over the counter-doped layer 104. The source 106 and the counter-doped layer 104 may be formed on the substrate 102 incorporating dopants into the substrate 102 or forming an epitaxial growth on the substrate 102. In an embodiment, the source 106 is heavily doped with an n-type dopant, such as, for example, phosphorus or arsenic. The dopant level in the source 106 is in a range from about 3E20 atoms/cm$^3$ to about 8E20 atoms/cm$^3$. In an alternative embodiment, the source 106 is heavily doped with a p-type dopant, such as, for example, boron or gallium. In an embodiment, the source 106 may be referred to as a first source drain.

The counter-doped layer 104 includes a dopant that is different/opposite the dopant in the doped source 106. For example, when the doped source 106 includes an n-type dopant, the counter-doped layer 104 includes a p-type dopant, and when the doped source 106 includes a p-type dopant, the counter-doped layer 104 includes an n-type dopant. In an embodiment, the counter-doped layer 104 is lightly doped with a p-type dopant, such as, for example, boron or gallium. The thickness of the counter-doped layer 104 may be in a range from about 5 to about 50 nm, or from about 10 to about 20 nm. The thickness of the source 106 may be in a range from about 50 to about 250 nm, or from about 70 to about 150 nm. The counter-doped layer 104 forms a diode and acts as an insulator, insulating the source 106 from the substrate 102 such that electrical current does not dissipate into the substrate 102.

A dummy gate 110 is disposed on the source 106 between a first spacer 108 and a second spacer 112. The first spacer 108 is deposited on the source 106, the dummy gate 110 is deposited on the first spacer 108, and the second spacer 112 is deposited on the dummy gate 110.

The first spacer 108 and second spacer 112 may include an insulating material, such as, for example, silicon dioxide, silicon nitride, SiOCN, or SiBCN. Other non-limiting examples of materials for the first spacer 108 and the second spacer 112 may include dielectric oxides (e.g., silicon oxide), dielectric nitrides (e.g., silicon nitride), dielectric oxynitrides, or any combination thereof. The first spacer 108 and second spacer 112 materials are deposited by a deposition process, for example, chemical vapor deposition (CVD) or physical vapor deposition (PVD). The first spacer 108 and the second spacer 112 may each have a thickness of about 3 to about 15 nm, or of about 5 to about 10 nm.

The dummy gate 110 may include a sacrificial gate material, for example, amorphous silicon (α-Si) or polycrystalline silicon (poly-silicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 110 may have a thickness of about 8 nm to about 100 nm, or from about 10 nm to about 30 nm.

A dielectric capping layer 114 is deposited on the second spacer 112 over the dummy gate 110. The dielectric capping layer 114 may also be referred to as an oxide layer. Non-limiting examples of materials for the dielectric capping layer 114 may include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The dielectric capping layer 114 may have a thickness in a range from about 30 nm to about 200 nm, or from about 50 nm to about 100 nm.

Figure 2:
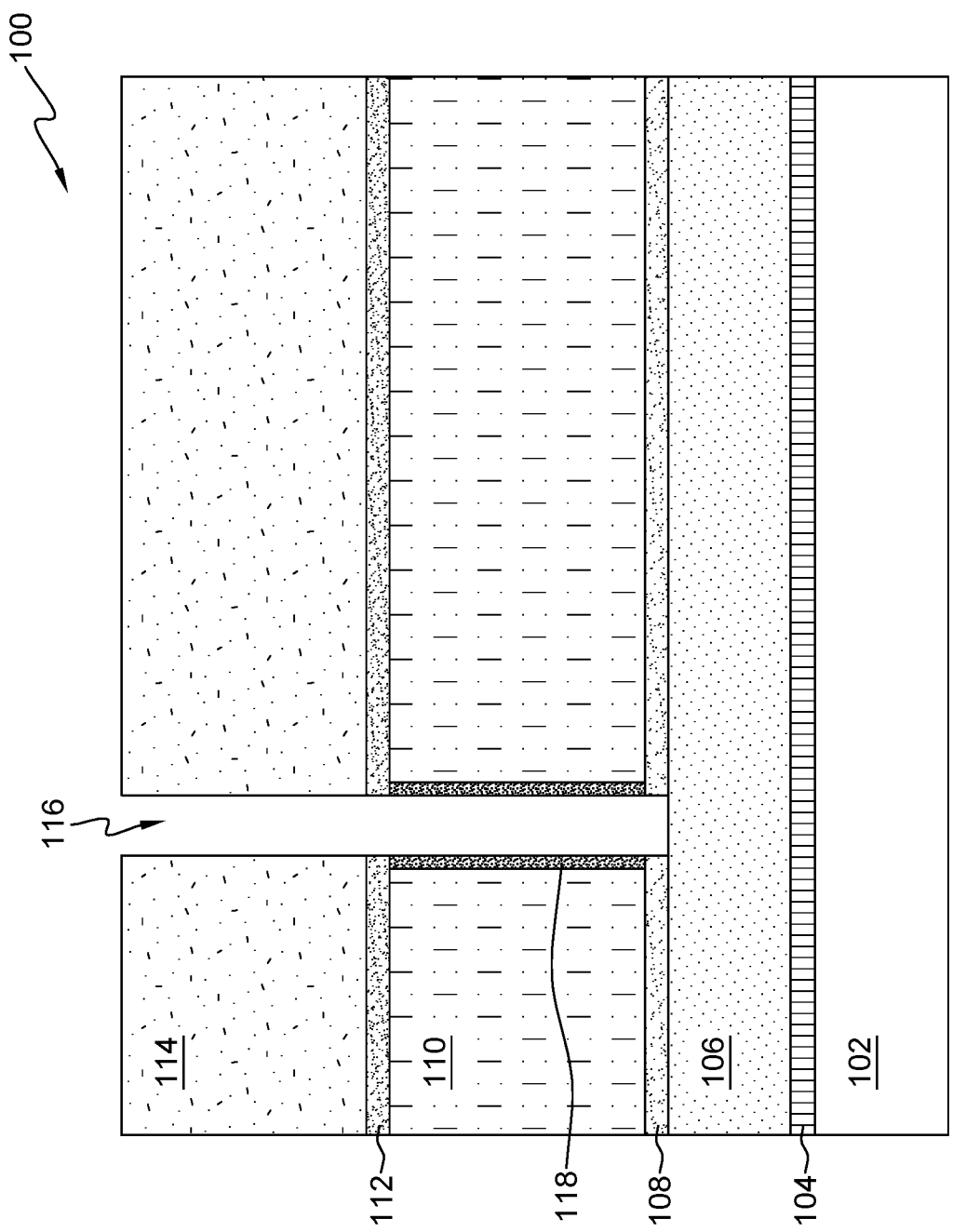
FIG. 2 is a cross section view illustrating a trench formed to expose a source according to an exemplary embodiment.

Referring now to FIG. 2, the structure 100 with a trench 116 is shown, in accordance with an embodiment. The trench 116 extends from a top surface of the dielectric capping layer 114 to the source 106, exposing the top surface of the source 106. The trench 116 is formed by performing an etch process that is selective to (will not substantially remove) the source 106 material. The etch process may be, for example, a reactive ion etch.

Multiple etching processes may be performed to form the trenches 116 within the structure 100. For example, a first etching process may be performed to remove a portion of the dielectric capping layer 114 selective to the material of the second spacer 112. A second etching process may then be performed to remove a portion of the second spacer 112, which underlies the portion of the trench 116 formed from the first etching process, selective to the material of the dummy gate 110. A third etching process may then be performed to remove a portion of the dummy gate 110, which underlies the portion of the trench 116 formed from the second etching process, selective to the material of the first spacer 108. A fourth etching process may then be performed to remove a portion of the first spacer 108, thereby exposing a top surface of the source 106. The resulting trench 116 may extend through a top surface of the dielectric capping layer 114 down to a top surface of an exposed portion of the source 106. The width of the trench 116 may be about 3 nm to about 20 nm, or about 5 nm to about 10 nm. The depth of the trench 116 may be about 50 nm to about 300 nm, or from about 100 nm to about 200 nm.

Once the trench 116 is formed, portions of the dummy gate 110 sidewalls are oxidized. The oxidation allows for an oxide layer 118 to be formed along the sidewalls of the trench 116. The oxidation may be performed by a plasma oxidation process or any other oxidation process that forms the oxide layer 118. A portion of the first spacer 108 or the source 106 also may be oxidized. However, any oxide formed in these regions may be removed before performing additional steps described herein with reference to FIGS. 3-11.

Figure 3:
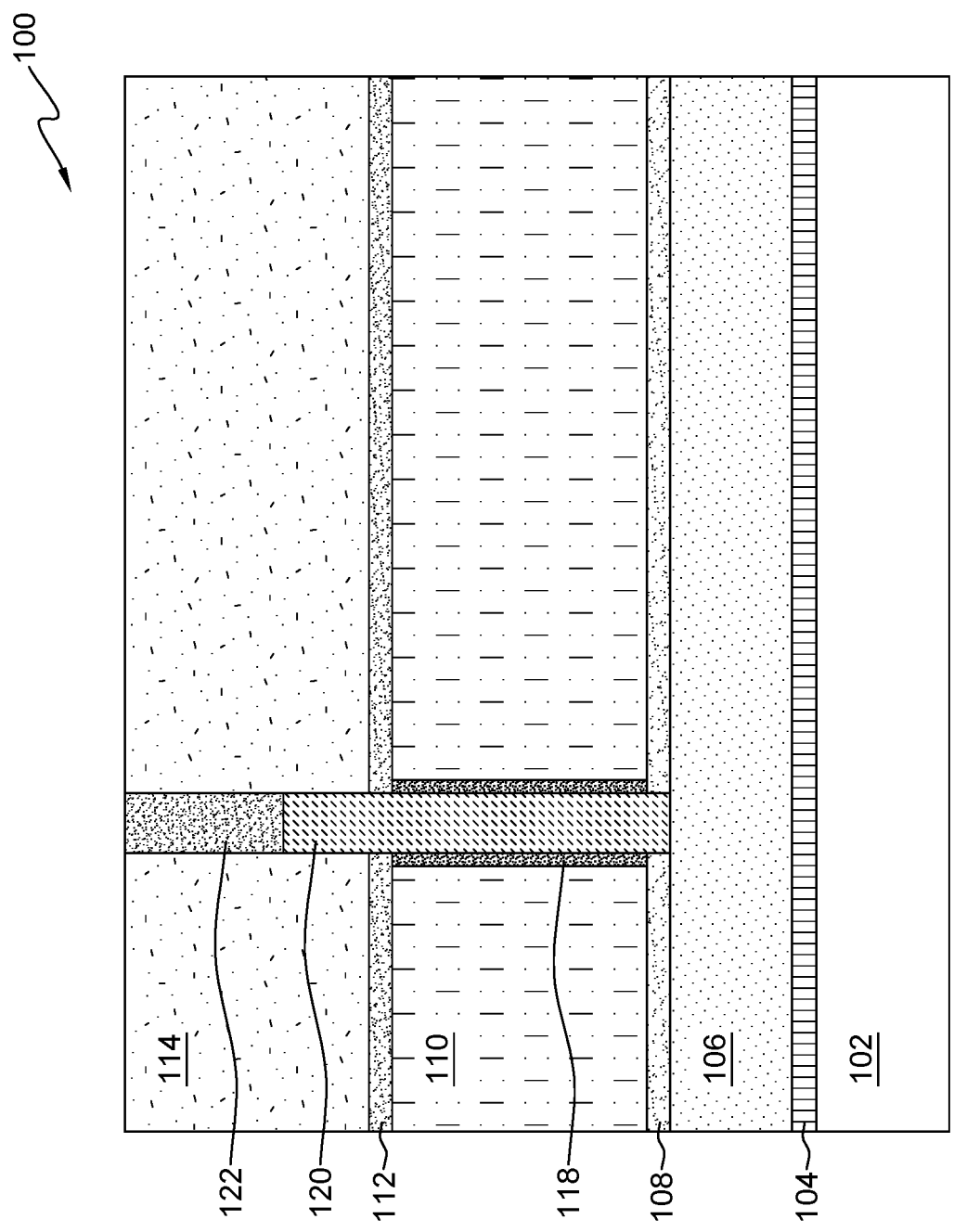
FIG. 3 is a cross section view illustrating an epitaxial layer and a dielectric cap according to an exemplary embodiment.

Referring now to FIG. 3, the structure 100 with an epitaxial channel 120 and a dielectric cap 122, is shown in accordance with an embodiment. Once the exposed portions of the dummy gate 110 sidewalls are oxidized, an epitaxial layer is grown on the top surface of the source 106 to form the epitaxial channel 120. The epitaxial growth may include an epitaxial semiconductor material, and the epitaxial growth and/or deposition processes may be selective to forming on semiconductor surface, and do not deposit material on other surfaces, such as the oxide layer 118, the first spacer 108 or the second spacer 112.

The epitaxial channel 120 is doped with the same type of dopant as the source 106. In an embodiment, the epitaxial channel 120 is doped with an n-type dopant, such as, for example, phosphorus or arsenic. The dopant level in the epitaxial channel 120 is lower than the dopant level in the source 106. The dopant level in the epitaxial channel 120 is about 5E20 atoms/cm$^3$.

The epitaxial channel 120 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial channel material may be, for example, n-type silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

During the growth process, the epitaxial growth in the epitaxial channel 120 may extend over the dielectric capping layer 114 (not illustrated). A planarization process, such as, for example, a chemical mechanical polishing (CMP) process, may be used to remove excess epitaxial growth over the dielectric capping layer 114. In addition, the epitaxial channel 120 may be partially recessed and then back filled with a dielectric cap 122. The epitaxial channel 120 may be partially recessed to a level that is still within the dielectric capping layer 114 but above the second spacer 112. The epitaxial channel 120 may be recessed by etching, for example, by a reactive ion etch or a wet etch process.

The opening formed over the recessed epitaxial channel 120 is filled with a dielectric material, forming a dielectric cap 122 over the epitaxial channel 120. The dielectric cap 122 may be made from a dielectric material, such as, for example, a dielectric oxide (e.g., silicon oxide), a dielectric nitride (e.g., silicon nitride), a dielectric oxynitride, or any combination thereof. The dielectric material is deposited by a deposition process, for example, chemical vapor deposition (CVD) or physical vapor deposition (PVD). After its formation, the dielectric cap 122 is planarized by, for example, CMP.

Figure 4:
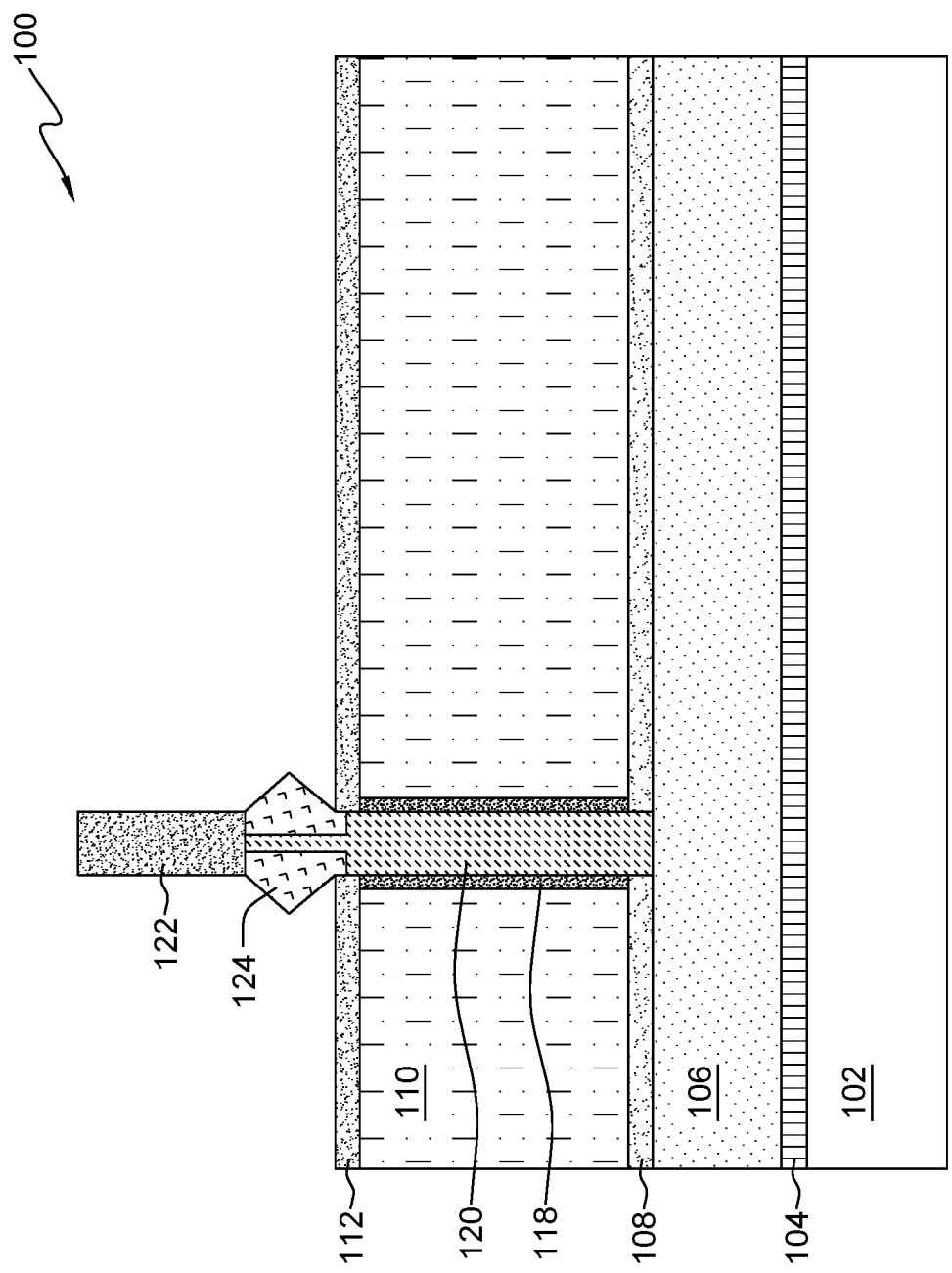
FIG. 4 is a cross section view illustrating forming a drain on the epitaxial channel according to an exemplary embodiment.

Referring now to FIG. 4, the structure 100 with a drain 124 is show, in accordance with an embodiment. Substantially all of the dielectric capping layer 114 is removed, thereby exposing the top surface of the second spacer 112. The dielectric capping layer 114 may be etched using a process that is selective to (will not substantially remove) the second spacer 112. Once the dielectric capping layer 114 is removed, the drain 124 is epitaxially grown from an exposed sidewall of the epitaxial channel 120. The drain 124 is doped with the same type of dopant as the source 106 and the epitaxial channel 120. In an embodiment, the drain is doped with an n-type dopant, such as, for example, phosphorus or arsenic. The dopant level in the drain 124 is higher than the dopant level in the epitaxial channel 120. The dopant level in the drain 124 is about 3E20 atoms/cm$^3$. In an embodiment, the drain 124 and the source 106 have a higher doping concentration than the epitaxial channel 120. In an embodiment, the drain 124 may be referred to as a second source drain.

The drain 124 is arranged between the dielectric cap 122 and the epitaxial channel 120. The drain 124 is also arranged between the dielectric cap 122 and the dummy gate 110. A portion of the epitaxial channel 120 over the second spacer 112 may be recessed along sidewalls before forming the drain 124. The drain 124 is the facetted epitaxy source drain region of the vertical transistor. The faceted drain 124 grows in a shape of a pointed cone, wherein the points of the drain 124 extend horizontally away from the epitaxial channel 120. The pointed cone shape of the drain 124 enhances the electric field at the tip of the cone.

Figure 5:
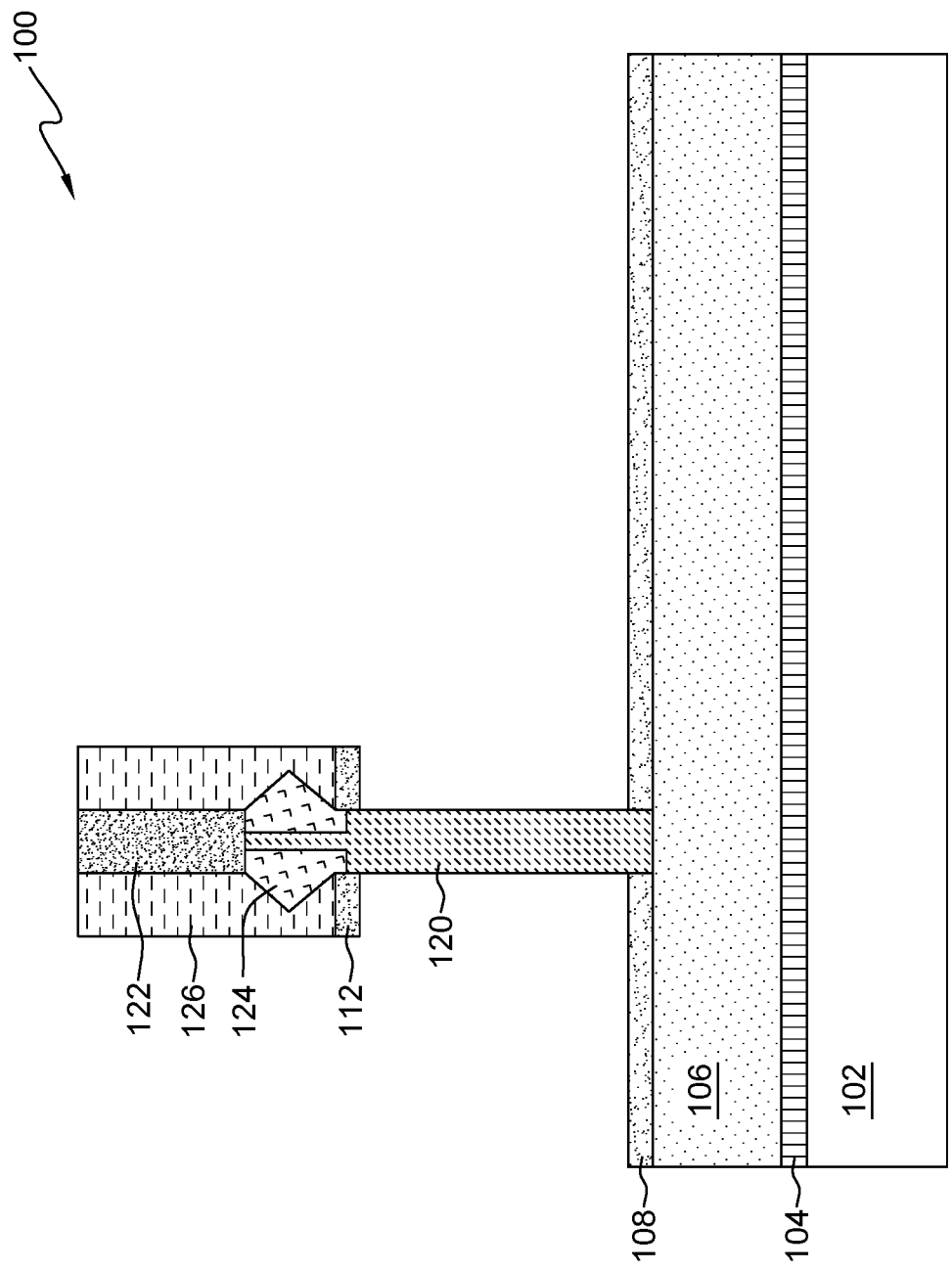
FIG. 5 is a cross section view illustrating removing the dummy gate and an oxide layer according to an exemplary embodiment.

Referring now to FIG. 5, the structure 100 with the dummy gate and the oxide layer removed and a deposited third spacer 126 is shown, in accordance with an embodiment. The third spacer 126 is deposited on the drain 124 protecting the drain 124 during subsequent fabrication. The third spacer 126 is also disposed on a sidewall of the dielectric cap 122. The third spacer 126 may include an insulating material, for example, dielectric oxides (e.g., silicon oxide), dielectric nitrides (e.g., silicon nitride), dielectric oxynitrides, or any combination thereof. The third spacer 126 material is deposited by a deposition process, for example, chemical vapor deposition (CVD) or physical vapor deposition (PVD). The third spacer 126 may be etched by a dry etch process, for example, a RIE process, such that it covers the drain 124 and is removed from a top surface of the dielectric cap 122 and the second spacer 112.

Once the third spacer 126 is deposited, portions of the second spacer 112 and the dummy gate 110 are removed. The second spacer 112 and the dummy gate 110 are recessed to remove portions that extend horizontally beyond the third spacer 126 material. An etch process that is selective to (will not substantially remove) the first spacer 108 is performed. The etch process may be a dry etch process, such as an RIE process. Another etch process, such as, for example, a wet etch process that includes hot ammonia, is used to remove the remaining dummy gate beneath the second spacer 112 and the oxide layer 118 such that the sidewalls of the epitaxial channel 120 are exposed.

Figure 6:
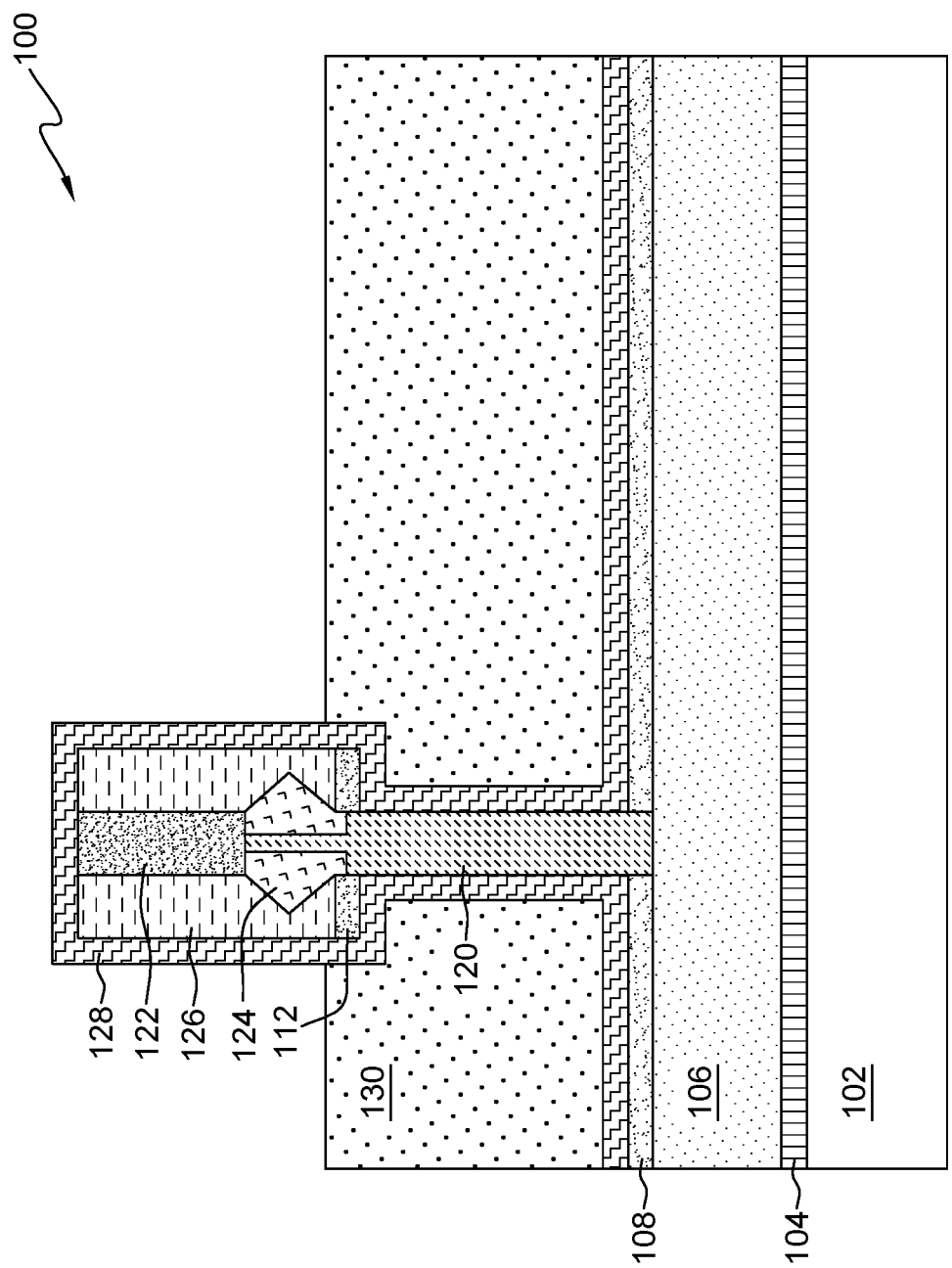
FIG. 6 is a cross section view illustrating depositing a first dielectric layer and a floating gate material according to an exemplary embodiment.

Referring now to FIG. 6, the structure 100 with a first dielectric layer 128 and a floating gate material 130 is shown, in accordance with an embodiment. The first dielectric layer 128 is conformally deposited along the top surface of the structure 100. The first dielectric layer 128 is disposed on the first spacer 108, the epitaxial channel 120, the third spacer 126, and the remaining portions of the second spacer 112 beneath the drain 124.

The first dielectric layer 128 may be made of a high-k dielectric material having a dielectric constant greater than 3.9, 7.0, or 10.0. Non-limiting examples of suitable materials for the first dielectric layer 128 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

In an embodiment, first dielectric layer 128 is between 1-2 nm thick. The first dielectric layer 128 separates the epitaxial channel 120 from the floating gate material 130, reducing the leakage current effect. The first dielectric layer 128 may have a lower conduction band-offset with the epitaxial channel 120 than its valance band-offset and a lower effective mass for electrons than holes. In addition, the first dielectric layer 128 is a tunneling dielectric which allows direct tunneling of carriers, compared to conventional thicker dielectric that is used for Fowler-Nordheim tunneling.

The first dielectric layer 128 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes.

The floating gate material 130 is deposited onto the top surface of the first dielectric layer 128 such that top portions of the floating gate material 130 and top portions of the first dielectric layer 128 are substantially flush. The floating gate material 130 may act as a conductor. Non limiting examples of materials used to form the floating gate material 130 may include aluminum (Al), platinum (Pt), gold (Au), tungsten (W), titanium (Ti), or any combination thereof, polysilicon, or a dielectric material, such as, for example, silicon nitride. The conductive material may be deposited by a suitable deposition process, for example, CVD, PECVD, PVD, plating, thermal or e-beam evaporation, and sputtering. The floating gate material 130 may be doped with a dopant that is opposite to the dopant used to dope the epitaxial channel 120. For example, if the epitaxial channel 120 is doped with an n-type dopant, then the floating gate material 130 may be doped with a p-type dopant.

After the floating gate material 130 is deposited, a planarization process, such as, for example, a CMP process, may be used to remove excess floating gate material 130 from the top surface of the structure 100. After which, an anisotropic etch, such as, for example, a RIE process, may be performed to recess the floating gate material 130 such that a top surface of the floating gate material 130 extends above the top surface of the second spacer 112.

Figure 7:
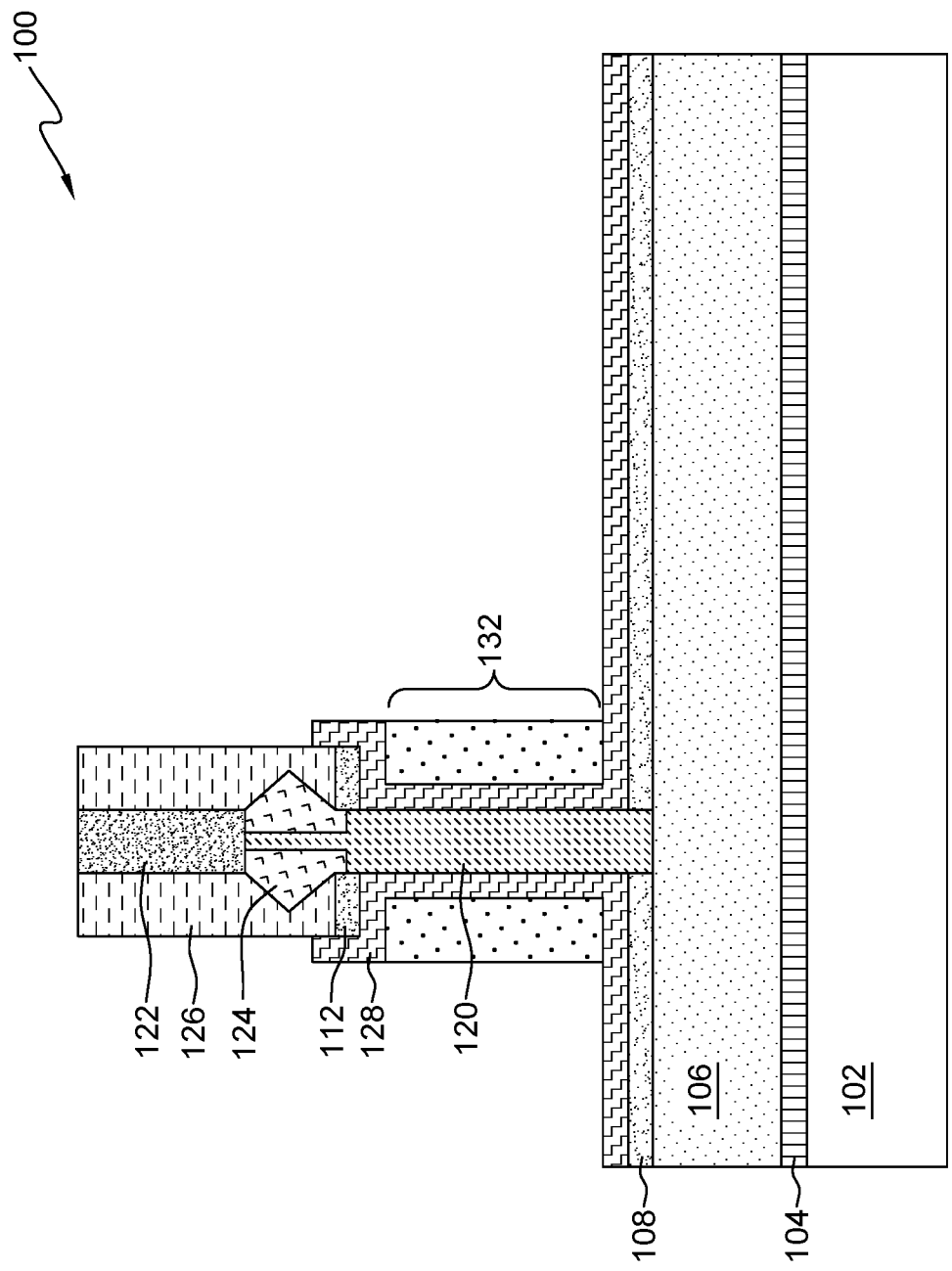
FIG. 7 is a cross section view illustrating removing portions of the first dielectric layer and the floating gate material to form a floating gate according to an exemplary embodiment.

Referring now to FIG. 7, the structure 100 with portions of the first dielectric layer 128 and the floating gate material 130 removed, is shown in accordance with an embodiment. The structure 100 may undergo an etch process, such as, for example, a RIE process, to remove the exposed portions of the first dielectric layer 128, exposing the sidewalls of the third spacer 126 and the top portion of the dielectric cap 122. Further, the floating gate material 130 is recessed to remove portions of the floating gate material 130 that extend horizontally beyond the third spacer 126 material, thus forming a floating gate 132. An etch process that is selective to (will not substantially remove) the first dielectric layer 128 is performed. The etch process may be a dry etch process, such as an RIE process. The floating gate 132 may have a doping type that is opposite to that of the epitaxial channel 120. In addition, the first dielectric layer 128 may have a lower barrier for the tunneling of majority carriers from the epitaxial channel 120 into the floating gate 132 compared to that for minority carriers in the epitaxial channel 120.

Figure 8:
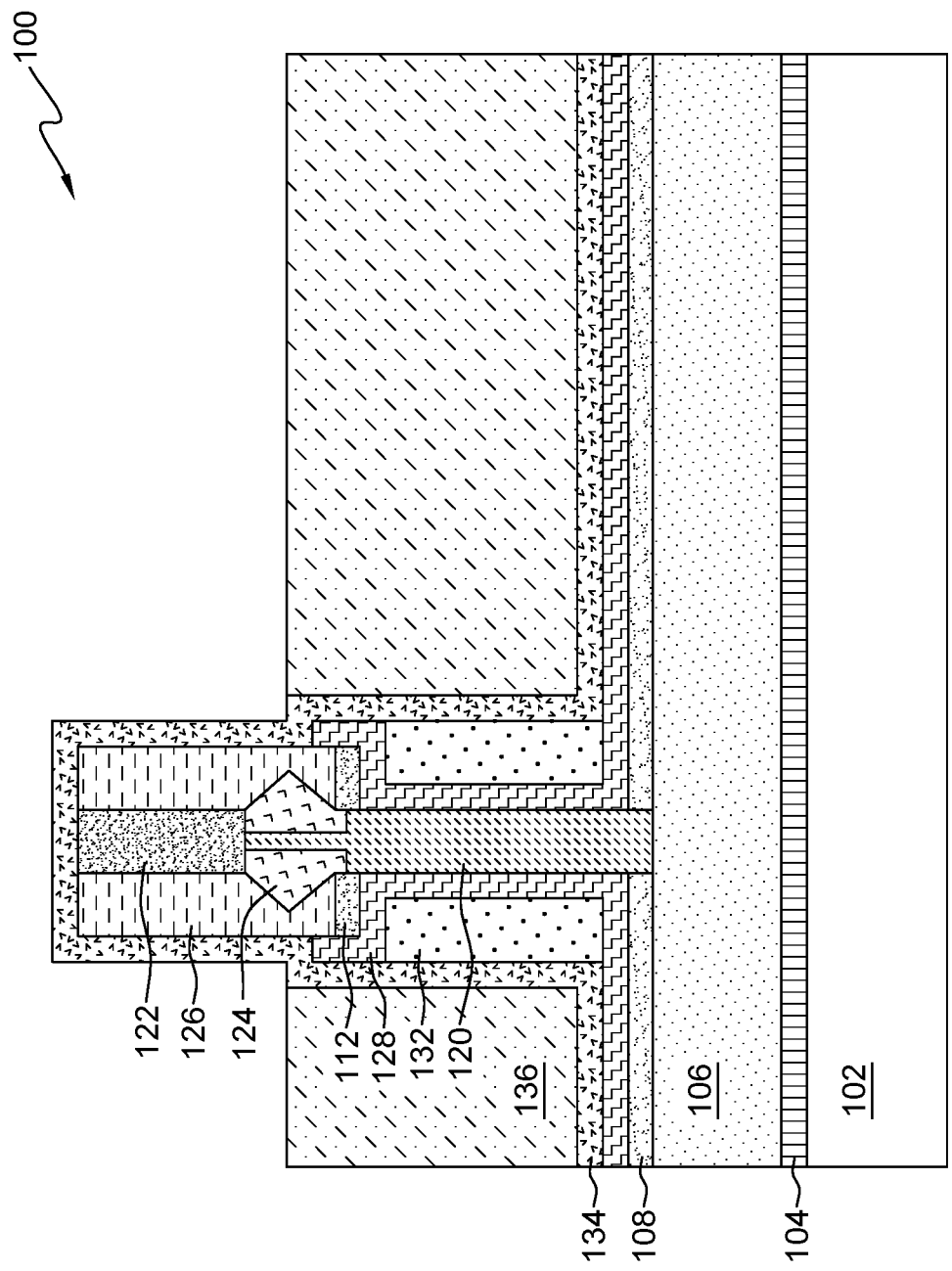
FIG. 8 is a cross section view illustrating depositing a second dielectric layer and a control gate material according to an exemplary embodiment.

Referring now to FIG. 8, the structure 100 with a second dielectric layer 134 and a control gate material 136 is shown in accordance with an embodiment. The second dielectric layer 134 is conformally deposited along the top surface of the structure 100. The second dielectric layer 134 is disposed on the first dielectric layer 128, the third spacer 126, and the dielectric cap 122.

The second dielectric layer 134 may be made of a dielectric material having a dielectric constant greater than 3.9, 7.0, or 10.0. Non-limiting examples of suitable materials for the second dielectric layer 134 include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The second dielectric layer 134 separates the first dielectric layer 128 and the floating gate 132 from the control gate material 136. The second dielectric layer 134 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the second dielectric layer 134 may vary depending on the deposition process as well as the composition and number of high-k dielectric materials used.

The control gate material 136 is deposited onto the top surface of the second dielectric layer 134 such that top portions of the control gate material 136 and top portions of the second dielectric layer 134 are substantially flush. The control gate material 136 may act as a conductor. Non limiting examples of materials used to form the control gate material 136 may include aluminum (Al), platinum (Pt), gold (Au), tungsten (W), titanium (Ti), or any combination thereof, polysilicon, or a dielectric material, such as, for example, silicon nitride. The conductive material may be deposited by a suitable deposition process, for example, CVD, PECVD, PVD, plating, thermal or e-beam evaporation, and sputtering.

After the control gate material 136 is deposited, a planarization process, such as, for example, a CMP process, may be used to remove excess control gate material 136 from the top surface of the structure 100. After which, an anisotropic etch, such as, for example, a RIE process, may be performed to recess the control gate material 136. The control gate material 136 is recessed such that a top surface of the control gate material 136 extends above the top surface of the second spacer 112 and a bottom portion of the third spacer 126.

Figure 9:
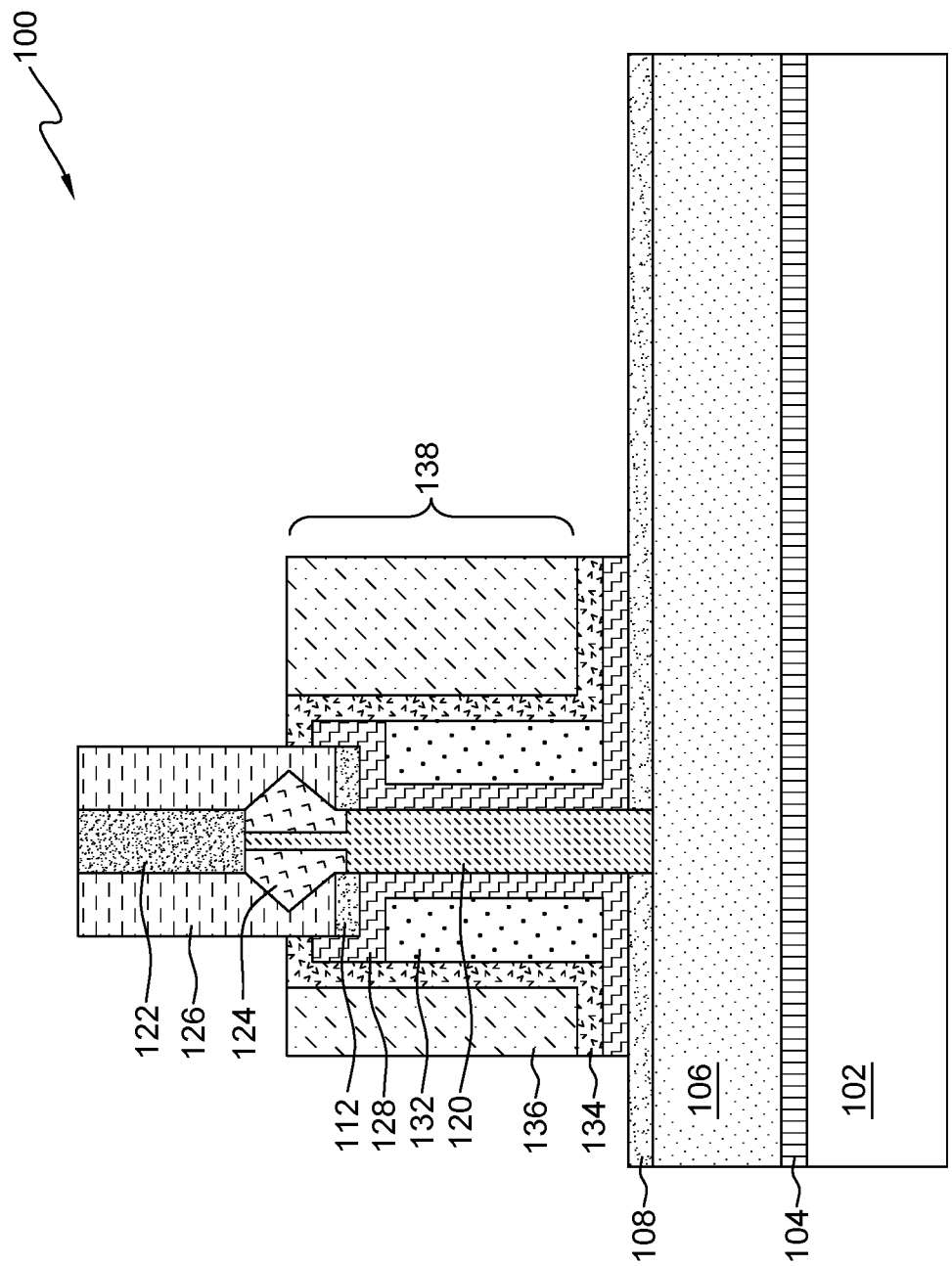
FIG. 9 is a cross section view illustrating removing portions of the second dielectric layer and the control gate material to form a control gate according to an exemplary embodiment.

Referring now to FIG. 9, the structure 100 with portions of second dielectric layer 134 and the control gate material 136 removed to form a control gate 138, is shown in accordance with an embodiment. The structure 100 may undergo an etch process, such as, for example, a RIE process, to remove the exposed portions of the second dielectric layer 134, exposing the sidewalls of the third spacer 126 and the top portion of the dielectric cap 122.

Once portions of the second dielectric layer 134 are removed, the control gate material 136 is patterned. Patterning may be performed by lithography and etching. The pattern is transferred into the control gate material 136 and an etch process is used to remove a portion of the control gate material 136 and define the control gate 138. The etch process is selective to (will not substantially remove) the first spacer 108. The etch process may be a dry etch process, such as an RIE process. The control gate 138 encompasses the floating gate 132.

Figure 10:
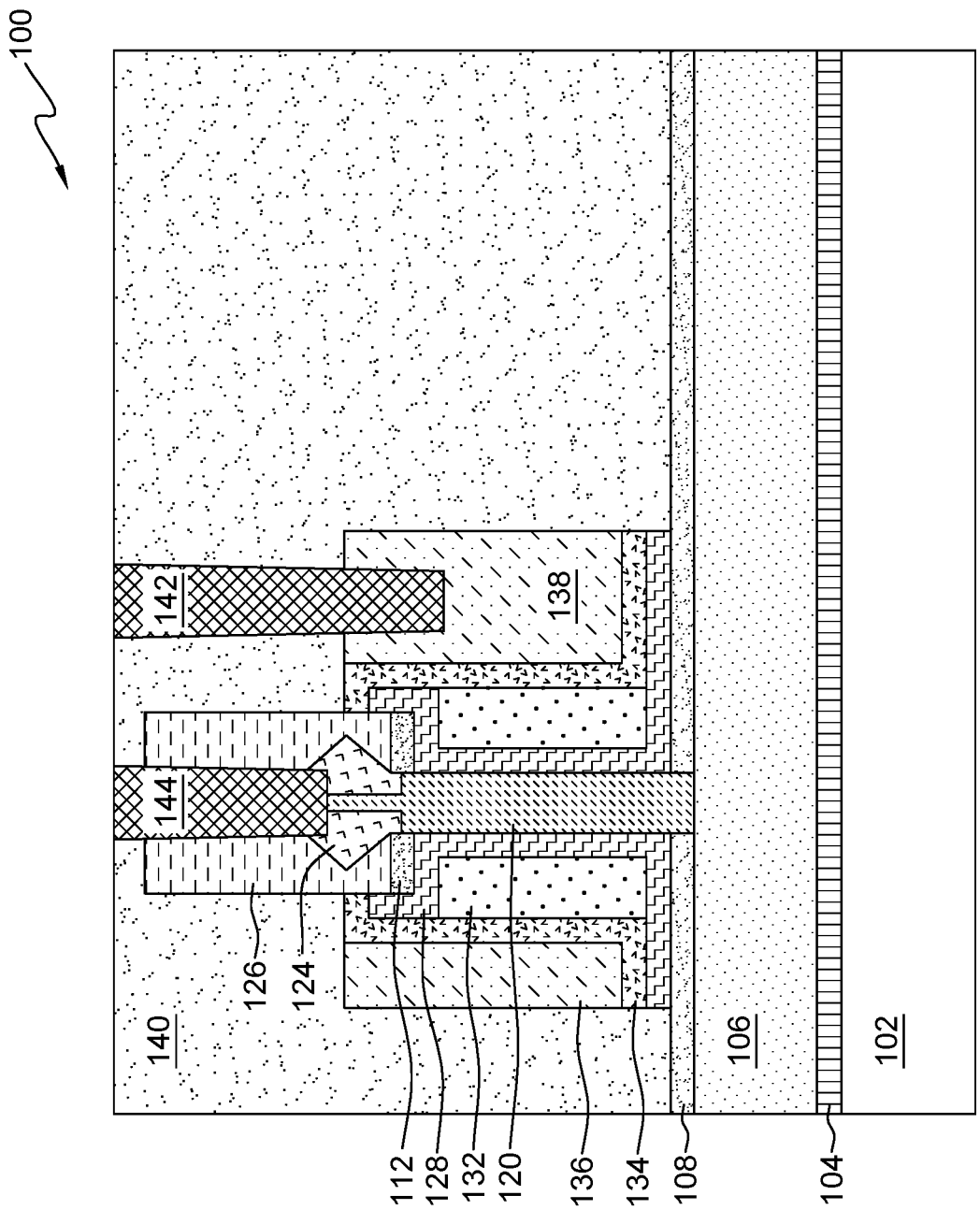
FIG. 10 is a cross section view illustrating depositing an interlayer dielectric and forming contacts according to an exemplary embodiment.

Referring now to FIG. 10, the structure 100 with an interlayer dielectric (ILD) 140, a control gate contact 142, and a drain contact 144 is shown, in accordance with an embodiment. Once the control gate 138 is defined, the ILD 140 may be deposited such that top surface of the ILD 140 is above the top surfaces of the dielectric cap 122 and the third spacer 126. The ILD 140 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof. The ILD 140 is deposited by a deposition process, including, but not limited to CVD, PVD, plasma enhanced CVD, atomic layer deposition (ALD), evaporation, chemical solution deposition, or like processes. After the ILD 140 is deposited, a planarization process, such as, for example, a CMP process, may be used to remove excess ILD 140 from the top surface of the structure 100.

The control gate contact 142 extends from the surface of the ILD 140 to the control gate 138. The control gate contact 142 is formed by patterning a trench in the ILD 140. To remove the ILD 140 and form the control gate contact trenches, a resist, such as a photoresist, may be deposited and patterned. An etch process, such as a RIE, may be performed using the patterned resist as an etch mask to remove the ILD 140 until the control gate 138 is exposed. The control gate contact trenches are filled with a conductive material or a combination of conductive materials to form the control gate contact 142. The conductive material may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 140.

The drain contact 144 extends through the ILD 140 and the dielectric cap 122 to the drain 124 and is formed within a trench. To remove the ILD 140 and form the drain trench, a resist, such as a photoresist, may be deposited and patterned. An etch process, such as a RIE, may be performed using the patterned resist as an etch mask to remove the ILD 140 and dielectric cap 122 until the drain 124 is exposed. The drain trench is filled with a conductive material or a combination of conductive materials to form the drain contact 144 (for example, bitline). The conductive material filling may be a conductive metal, for example, aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 140.

Figure 11:
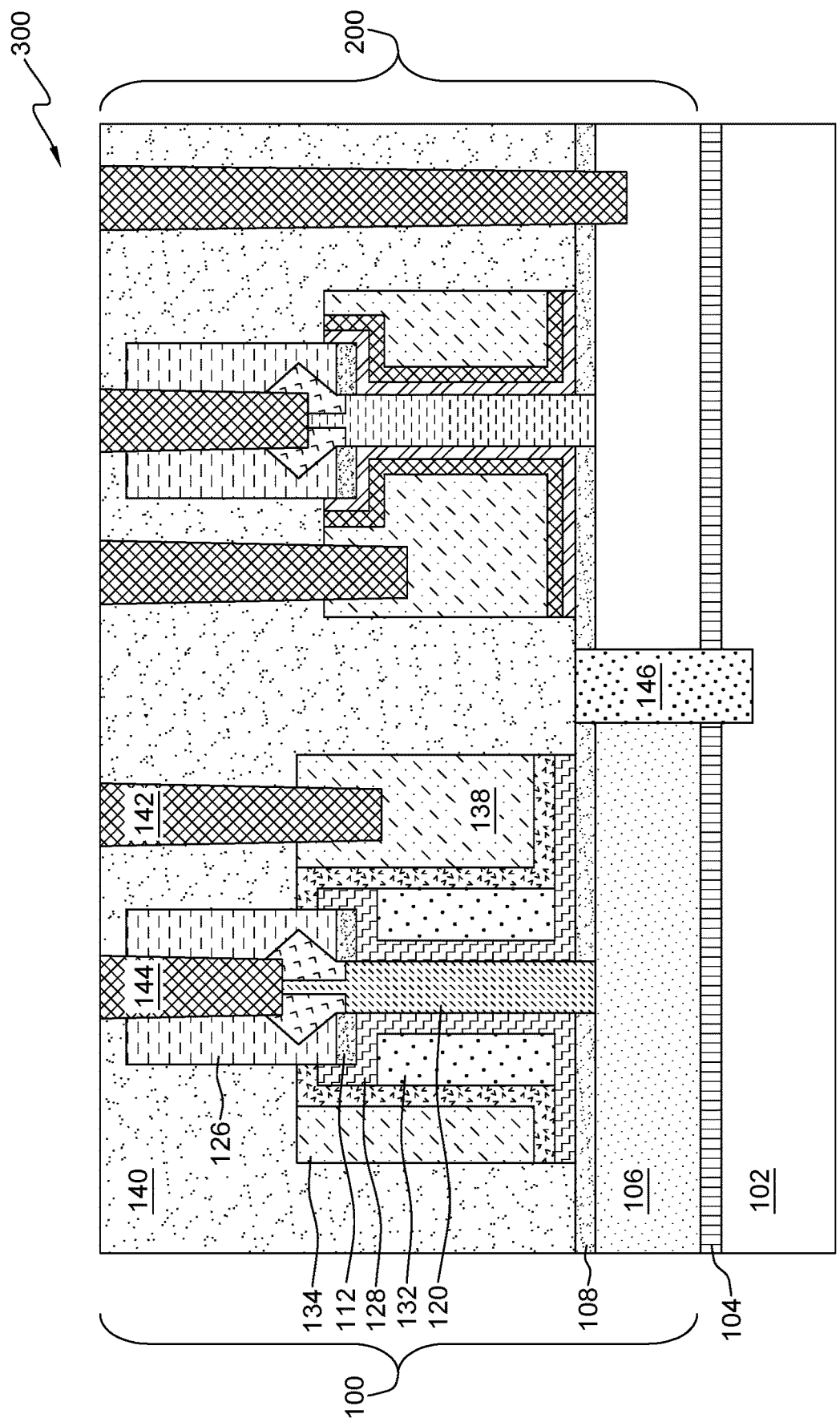
FIG. 11 is a cross section view illustrating a vertical field effect transistor and a low voltage flash according to an exemplary embodiment.
Figure 12:
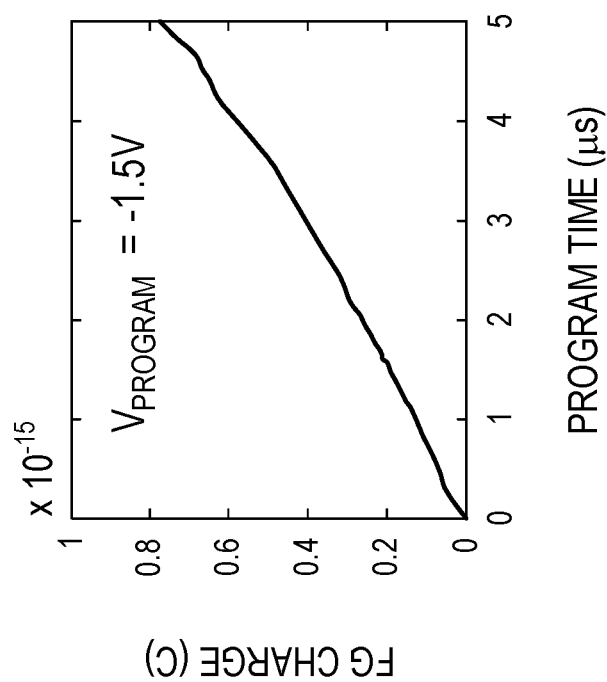
FIG. 12 is a graph showing drain current as a function of floating gate total charge (c) according to an embodiment.

Referring now to FIG. 11, a structure 300 is shown, in accordance with an embodiment. The structure 300 includes the structure 100 and a structure 200. The structure 100 is the low voltage flash memory, whereas the structure 200 is a VFET. The structure 100 may be separated from the structure 200 by a shallow trench isolation (STI) 146. Forming the STI 146 may be done in many ways known in the art, such as, for example, utilizing a single etch process, or multiple etching processes. The STI 146 is a form of a dielectric plug that separates the structure 100 from the structure 200 such that electrical current applied to the structure 100 has no effect on the structure 200. Typically, the STI 146 extends through a portion of the substrate 102 to a depth that allows for the two structures 100, 200 to be electrically separated.

The resultant structure 300, as illustrated in FIG. 11, includes a vertical low-voltage flash memory (structure 100) and a VFET (structure 200), separated by the STI 146. The vertical low-voltage flash memory includes the floating gate 132 surrounded by the control gate 138.

FIGS. 12-14 illustrate exemplary circuit diagrams that include a vertical low-voltage flash memory integrated with a VFET and a non-volatile memory element.

Referring now to FIG. 12, a simulated graph showing drain current as a function of floating gate total charge (C) is illustrated, in accordance with an embodiment. The floating gate of the vertical low-voltage flash memory (structure 100) may be charged linearly as a function of time. Therefore, the graph illustrates that the vertical low-voltage flash memory may be programmed in a linear fashion. Substantially linear response, at least up to fifty microseconds (50 µs), is achieved. The drain-source voltage ($V_{DS}$) is 0.0 V and the control gate voltage $V_{GS}$ is 1.5V.

Referring now to FIG. 13, simplified memory arrays 400 are shown, in accordance with an embodiment. The memory arrays 400 may include array blocks 150 and unit cells 152. The unit cells 152 may be standard unit cells 154 and shared unit cells 156.

The standard unit cells 154 may include one or more non-volatile memory elements, such as, for example, phase change memory (PCM), labelled $G^+$ and $G^-$, as well as the structure 100 (low-voltage flash memory) and the structure 200 (VFET). Other examples of non-volatile memory elements may include, but are not limited to, resistive random access memory, magnetic random access memory, or flash memory. The memory array 400 on the right side may also include a middle terminal 158 integrated in the standard unit cell 154 and the shared unit cell 156. The middle terminal 158 may be located between the structure 100 and the structure 200.

The structure 100 (low-voltage flash memory) provides a lower significance conductance while the non-volatile memory provides a higher significance conductance. In conventional unit cells, the lower significance conductance is provided by a capacitor. The low-voltage flash memory provides for higher retention times compared to a capacitor in a conventional unit cell. As a result, the state of memory does not have to be transferred as frequently to the PCM in order to achieve long term storage. In addition, integrating the low-voltage flash memory with the VFET and the PCM provides a simpler circuit compared to conventional circuits utilizing capacitors.

Referring now to FIG. 14, simplified circuit diagrams showing the shared unit cell 156 or equivalently, the low-voltage flash memory/VFET portion of the standard unit cell 154, with the middle terminal 158, on the right, and without the middle terminal 158, on the left, in accordance with an embodiment. Without the middle terminal 158, when the VFET (structure 200), which functions as a pass transistor, is turned off, the low-voltage flash memory (structure 100) operates in the linear (triode) region as there is no current or very low current flowing through the VFET. Therefore the source and drain of the low-voltage flash memory have approximately the same voltage as a bit line 160.

During the training phase, the VFET is switched off. The low-voltage flash memory is programmed by applying suitable voltage pulses of opposite polarities, such as, for example, positive or negative voltage pulses, to the control gate 138, illustrated in FIG. 9. The resistance of the epitaxial channel 120 of the low-voltage flash memory is increased or decreased by charging or discharging its floating gate 132, illustrated in FIG. 7, depending on the polarity of the voltage applied to the control gate 138. As such, during programming, the low-voltage flash memory is decoupled from the bit line 160 and/or word line. The low-voltage flash memory may be programmed by direct tunneling of charge carriers into and out of the floating gate 132.

Once training/programming is completed, the VFET may be switched on so that the resistance of the low-voltage flash memory may be read and/or transferred to the non-volatile memory. During reading, the low-voltage flash memory is coupled to the bit line 160 and/or word line. A suitable read voltage is applied to the control gate 138 of the low-voltage flash memory. The current flowing through the bit line 160 which is a measure of the memory state is detected by the peripheral circuitry, which may include, for example, a sense amplifier. The detected memory state may then be transferred to the non-volatile memory (e.g. by programming a corresponding conductivity change to the non-volatile memory) by the peripheral circuitry.

The middle terminal 158, illustrated in the circuit diagram on the right, provides more flexibility in terms of circuit programming in some embodiments. For example, having the middle terminal 158 allows for a desired program voltage to be applied between the middle terminal 158 and the control gate 138 of the low-voltage flash memory independent of the voltage that is on the bit line. In an embodiment, the middle terminal may be connected to a desired voltage, such as, for example, ground, thus allowing the low-voltage flash memory to be biased with a desired voltage across its drain-source. In an example, where the low-voltage flash memory is an n-channel device, the middle terminal 158 is biased at a voltage lower than the bit line 160 (thus functioning as the source terminal) allowing the low-voltage flash memory to be programmed independent of the bit line 160 voltage to the first order.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A circuit comprising:
   a low-voltage flash memory integrated with a vertical field effect transistor and a non-volatile memory element, the low-voltage flash memory is coupled to the non-volatile memory element by the vertical field effect transistor, one or more bit-lines, and one or more word-lines,
   wherein the low-voltage flash memory comprises:
      a source and a drain, the source separated from the drain by an epitaxial channel, wherein the source, the drain, and the epitaxial channel are doped with an n-type dopant;
      a floating gate, the floating gate separated from the epitaxial channel by a first dielectric layer; and
      a control gate, the control gate separated from the floating gate by a second dielectric layer.

2. The circuit of claim 1, wherein the low-voltage flash memory provides a lower significance conductance and the non-volatile memory element provides a higher significance conductance.

3. The circuit of claim 1, wherein the low-voltage flash memory is programmed by applying voltage pulses of opposite polarities to the control gate.

4. The circuit of claim 1, wherein the low-voltage flash memory is programmed by switching off the vertical field effect transistor and applying a program voltage to the control gate of the low-voltage flash memory.

5. The circuit of claim 1, wherein the low-voltage flash memory is read by turning on the vertical field effect transistor and applying a read voltage to the control gate of the low-voltage flash memory.

6. The circuit of claim 1, wherein the non-volatile memory element is a phase-change memory, resistive random access memory, magnetic random access memory, or a flash memory.

7. A semiconductor structure comprising:
   a low-voltage flash memory integrated with a vertical field effect transistor and a non-volatile memory element, the low-voltage flash memory is coupled to the non-volatile memory element by the vertical field effect transistor, one or more bit-lines, and one or more word-lines,
   wherein the low-voltage flash memory comprises:
      a first source drain region;
      a second source drain region, the second source drain region separated from the first source drain region by an epitaxial channel;
      a floating gate, the floating gate separated from the epitaxial channel by a first dielectric layer wherein the floating gate has a doping type that is opposite to a doping type of the epitaxial channel; and
      a control gate, the control gate separated from the floating gate by a second dielectric Previously Presented.

8. The semiconductor structure of claim 7, wherein the first source drain region, the second source drain region, and the epitaxial channel are doped with an n-type dopant.

9. The semiconductor structure of claim 7, wherein the low-voltage flash memory is vertical.

10. The semiconductor structure of claim 7, wherein the low-voltage flash memory is separated from the vertical field effect transistor by a shallow trench isolation.

11. The semiconductor structure of claim 7, wherein the non-volatile memory element is a phase-change memory, resistive random access memory, magnetic random access memory, or a flash memory.

12. A semiconductor structure comprising:
   a low-voltage flash memory integrated with a vertical field effect transistor and a non-volatile memory element, the low-voltage flash memory is coupled to the non-volatile memory element by the vertical field effect transistor, one or more bit-lines, and one or more word-lines,
   wherein the low-voltage flash memory comprises:
      a first source drain region;
      a second source drain region, the second source drain region separated from the first source drain region by an epitaxial channel;
      a floating gate, the floating gate separated from the epitaxial channel by a first dielectric layer, wherein the first dielectric is made of high-k dielectric material; and
      a control gate, the control gate separated from the floating gate by a second dielectric layer.

13. The semiconductor structure of claim 12, wherein the first source drain region, the second source drain region, and the epitaxial channel are doped with an n-type dopant.

14. The semiconductor structure of claim 12, wherein the low-voltage flash memory is vertical.

15. The semiconductor structure of claim 12, wherein the low-voltage flash memory is separated from the vertical field effect transistor by a shallow trench isolation.

16. The semiconductor structure of claim 12, wherein the non-volatile memory element is a phase-change memory, resistive random access memory, magnetic random access memory, or a flash memory.

17. A method comprising:
   forming a low-voltage flash memory integrated with a vertical field effect transistor and a non-volatile memory element, the low-voltage flash memory is coupled to the non-volatile memory element by the vertical field effect transistor, wherein forming the low-voltage flash memory comprises:
   growing a first source drain region on a substrate;
   epitaxially growing an epitaxial channel on the first source drain region;

epitaxially growing a second source drain region on the epitaxial channel;

forming a floating gate around the epitaxial channel, wherein the floating gate has a doping type that is opposite to a doping type of the epitaxial channel; and forming a control gate around the floating gate, the control gate being separated from the floating gate by a first dielectric layer.

18. The method of claim 17, wherein the first dielectric layer is made of a high-k dielectric material.

19. The method of claim 17, wherein the first source drain region, the epitaxial channel, and the second source drain region are doped with an n-type dopant.

20. The method of claim 17, wherein the non-volatile memory element is a phase-change memory, resistive random access memory, magnetic random access memory, or a flash memory.

21. The method of claim 17, further comprising:

forming a shallow trench isolation between the low-voltage flash memory and the vertical field effect transistor.

* * * * *